(12) United States Patent
Barash et al.

(10) Patent No.: US 8,956,885 B2
(45) Date of Patent: Feb. 17, 2015

(54) METHOD AND PROCESS TO REDUCE STRESS BASED OVERLAY ERROR

(71) Applicant: GLOBALFOUNDRIES Inc., Grand Cayman (KY)

(72) Inventors: Eugene Barash, Niskayuna, NY (US); Jiejie Xu, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 100 days.

(21) Appl. No.: 13/903,089

(22) Filed: May 28, 2013

(65) Prior Publication Data

US 2014/0356980 A1 Dec. 4, 2014

(51) Int. Cl.
| | |
|---|---|
| *H01L 21/00* | (2006.01) |
| *H01L 21/66* | (2006.01) |
| *H01L 21/263* | (2006.01) |
| *H01L 21/268* | (2006.01) |

(52) U.S. Cl.
CPC ............ *H01L 22/12* (2013.01); *H01L 21/2636* (2013.01); *H01L 21/268* (2013.01)
USPC .................................. 438/5; 438/14; 438/795

(58) Field of Classification Search
None
See application file for complete search history.

(56) References Cited

U.S. PATENT DOCUMENTS

2010/0084744 A1   4/2010   Zafiropoulo et al.

OTHER PUBLICATIONS

O. Fujii et al. "Sophisticated Methodology of Dummy Pattern Generation for Suppressing Dislocation Induced Contact Misalignment on Flash Lamp Annealed eSiGe Wafer" pp. 156-157, 2009 Symposium on VLSI Technology Digest of Technical Papers.
Akio Shima, et al. "Dopant Profile Engineering of CMOS Devices Formed by Non-Melt Laser Spike Annealing" pp. 144-145, 2005 Symposium on VLSI Technology Digest of Technical Papers.

*Primary Examiner* — Scott B Geyer
(74) *Attorney, Agent, or Firm* — Heslin Rothenberg Farley & Mesiti, PC (57) ABSTRACT

Thermal processing and alignment methods and processes used during fabrication of semiconductor devices are provided. One method includes, for instance: obtaining a device after at least one laser annealing process is completed, the device including a substrate surface and at least one layer over the substrate surface; applying a mask layer to the at least one layer; performing lithography on the mask layer to form a top layer; positioning a first contact-to-gate layer over the top layer; checking alignment of electrical connections between the substrate surface and the first contact-to-gate layer; and determining if an adjustment is needed to at least one parameter of at least one laser annealing beam used during the laser annealing process. In enhanced aspects, the at least one laser annealing process includes: performing three laser anneals; applying three mask layers; and performing lithography three times.

20 Claims, 6 Drawing Sheets

METHOD AND PROCESS TO REDUCE STRESS BASED OVERLAY ERROR

FIELD OF THE INVENTION

The present invention relates to semiconductor devices and methods of fabricating semiconductor devices, and more particularly, to the thermal processing and alignment during contact formation.

BACKGROUND OF THE INVENTION

Semiconductor devices may use strained SiGe to reduce short channel effects to improve the device performance. However, SiGe structures are susceptible to strain relaxation causing wafer deformation during thermal annealing. When wafer deformation occurs it leads to stress induced misalignment errors during subsequent lithography processes which ultimately results in substantial yield losses in fabrication of state-of-the-art complementary metal-oxide-semiconductor ("CMOS") devices.

In addition, as devices are increasingly scaled down in size the contact-to-gate overlay requirements become more stringent. When the devices are scaled down the critical layers frequently fail to meet alignment targets due to the wafer deformation occurring during laser annealing, for example, laser spike annealing ("LSA"). The problem of the critical layers failing to properly align is aggravated by the fact that in-line metrology to quantify LSA-induced warpage is not readily available and becomes apparent only when the wafer fails for overlay at the lithography ("LIT") step. By the time the wafer reaches the LIT step it is too late to correct the root cause of the misalignment.

This process is problematic for the resultant semiconductor device because the wafer deformation and ultimate layer misalignment may cause the deformed wafer to be unusable. Further, currently used fabrication techniques fail to provide optimization to reduce misalignment errors at the critical layers.

BRIEF SUMMARY

The shortcomings of the prior art are overcome and additional advantages are provided through the provision, in one aspect, of a method which includes, for instance: obtaining a device after at least one laser annealing process is completed, the device including a substrate surface and at least one layer over the substrate surface; applying a mask layer to the at least one layer; performing lithography on the mask layer to form a top layer; positioning a first contact-to-gate layer over the top layer; checking alignment of electrical connections between the substrate surface and the first contact-to-gate layer; and determining if an adjustment is needed to at least one parameter of at least one laser annealing beam used during the laser annealing process.

In another aspect, a process is presented which includes, for instance: obtaining a device with a wafer and at least one layer on top of the wafer; performing at least one laser annealing to the at least one layer, the at least one laser annealing using at least one laser beam; applying a mask layer over the at least one layer; performing lithography on the mask layer to form a contact layer; arranging an overlay on top of the contact layer; inspecting the alignment of the contact layer with the overlay; determining an amount of wafer deformation; and adjusting the at least one laser beam to remove wafer deformation.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

The present disclosure addresses and enhances, inter alia, thermal processing, more specifically, laser anneal processing and alignment during semiconductor fabrication. Laser anneal processing typically includes using a laser beam that is, for example, a long, thin beam or image to scan across the surface of an upper layer of a semiconductor device to heat the upper layer. Generally only the upper layer of the semiconductor device is heated, thus enabling the quickly heated upper layer to be quickly cooled by the lower temperature of the rest of the semiconductor device after the laser beam has passed over the device.

Generally stated, disclosed herein are certain novel thermal processing methods, which provide significant advantages over the above noted, existing thermal processing methods. Advantageously, the thermal processing methods disclosed herein may improve alignment accuracy for critical layers, improve electrical test ("ET") parametric yield, and improve the process capability index ("Cpk"). Additionally, as explained herein, the thermal processing methods disclosed herein may decrease or eliminate wafer deformation caused by current laser annealing processes.

During fabrication a substrate or wafer will be processed through numerous procedures to create the semiconductor device. One such procedure is thermal processing of the substrate, for example, one type of thermal processing is laser spike annealing ("LSA"). The substrate experiences thermal processing in order to activate dopant atoms implanted in regions of the substrate, for example, source and drain regions, with minimal dopant diffusion.

Figure 1:
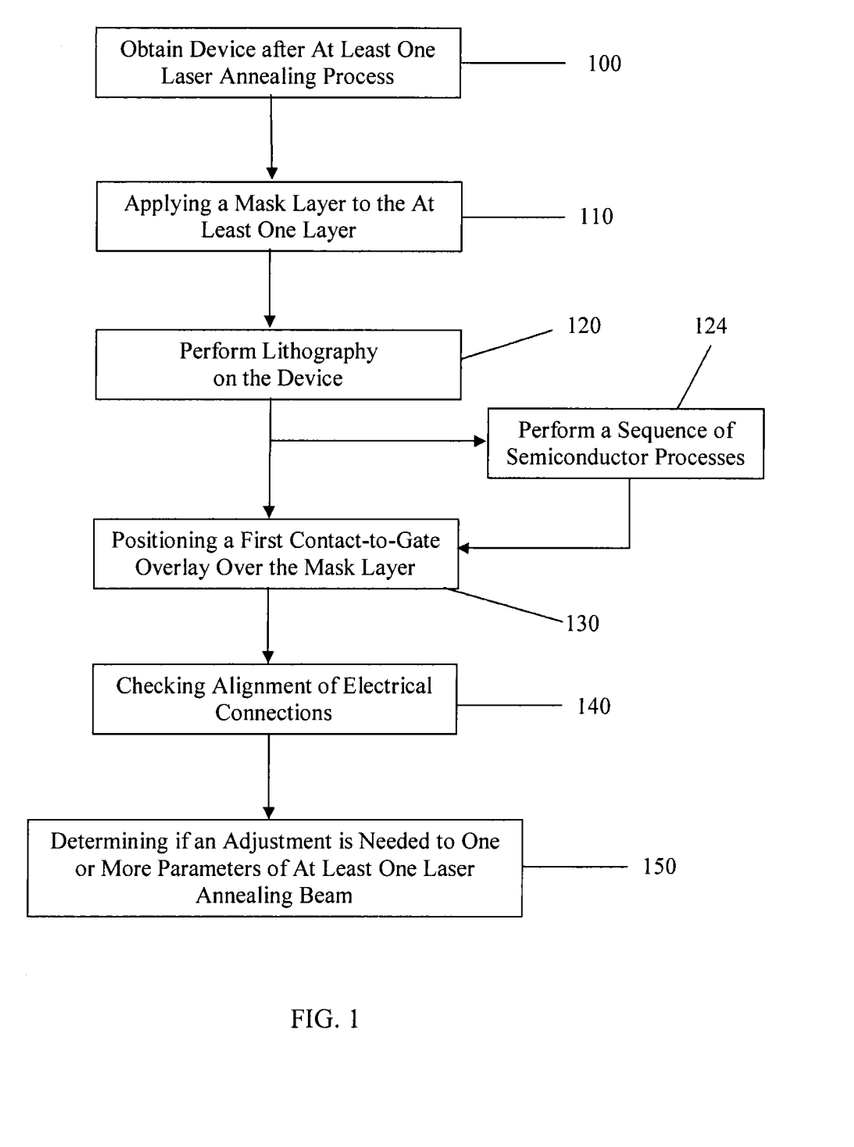
FIG. 1 depicts one embodiment of a portion of a process for fabricating, for instance, thermal processing and alignment of the layers of a semiconductor device, in accordance with one or more aspects of the present invention.

In one aspect, in one embodiment, as shown in FIG. 1, a portion of the semiconductor device fabrication process in accordance with one or more aspects of the present invention may include, obtaining a device after completion of at least one laser annealing process 100, applying a mask layer to the at least one layer 110, performing lithography on the mask layer of the device 120, positioning a first contact-to-gate layer over the mask layer 130, checking alignment of the electrical connections 140, and determining if an adjustment is needed to one or more parameters of at least one laser annealing beam 150. This process is inherent in the more detailed portions of the semiconductor device fabrication processes of FIGS. 2 and 3.

Figure 2:
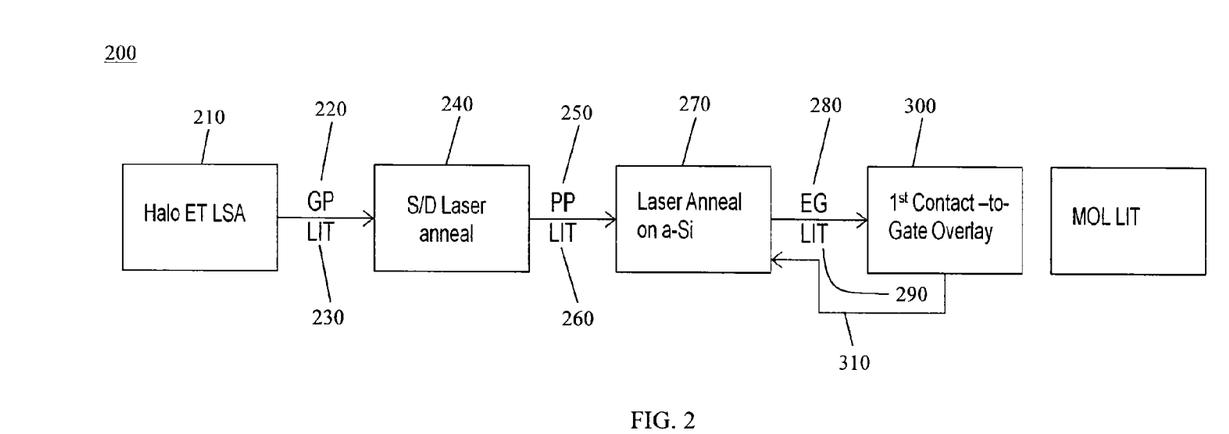
FIG. 2 depicts another embodiment of a portion of the process for fabricating, for instance, thermal processing and alignment of the layers of a semiconductor device, in accordance with one or more aspects of the present invention.

As illustrated in FIG. 2, in an embodiment, the portion of the semiconductor device fabrication process 200 in accordance with one or more aspects of the present invention may include: obtaining a device with at least one layer, laser spike annealing the top layer of the device 210, applying a first mask layer over the top layer 220, performing lithography on the first mask layer 230, laser annealing the source and drain layer 240, applying a second mask layer over the source and drain layer 250, performing lithography on the second mask layer 260, laser annealing an amorphous silicon ("a-Si") layer 270, applying a third mask layer over the a-Si layer 280, performing lithography on the third mask layer 290, positioning a first contact-to-gate layer over the third mask layer 300, and determining if an adjustment is needed to one or more parameters of at least one laser annealing beam used during the laser annealing process 310.

With continued reference to the fabrication processes of FIGS. 1 and 2, after lithography is performed on the mask layer 120, 290 a sequence of various semiconductor processes may be performed 124, for example, reactive ion etch ("RIE"), diffusion, cleans, etc., to form the desired topography on the wafer surface and/or the desirable dopant profile. The processes performed on the wafer may be selected to obtain a wafer with the desired electrical properties. In addition, in one embodiment, as described above, lithography may be performed on the mask layers, resulting in the mask layers becoming part of the device. In an alternative embodiment, the mask layers may be removed or stripped from the surface of the device prior to performing the lithography steps. In yet another embodiment, some mask layers may be stripped from the surface of the device prior to lithography while lithography may be performed on other mask layers.

By way of specific example, as shown in FIG. 2, the adjustment of one or more parameters of at least one laser annealing beam may occur to the laser annealing beam used during the laser annealing process 270 before the first contact-to-gate layer occurs. Adjustment may be necessary when errors are induced due to warpage or deformation of the substrate or device during the laser annealing process. When adjustment is necessary the dwell time may be altered by adjusting the beam parameters to provide the optimum stage velocity, temperature ramp rate and cool down rate, as well as scan direction. The dwell time is the time that a point on a substrate or device is exposed to the beam during laser annealing. Dwell time ($t_d$) may be calculated by dividing the beam width (W) by the scan speed ($V_{stage}$) using the formula:

$$t_d = W/V_{stage}.$$

As illustrated in FIGS. 4-7, the beam 312 may scan a substrate or wafer in a scan direction 314 and include a desired length ($l_1$) and width ($w_1$). The scan direction 314 may occur, for example, in the x-direction along the substrate, where the x-direction is, for example, from side to side on the substrate top surface. The direction of the scan may be changed during thermal processing in order to reduce overlay errors. By way of specific example, the beam 312 may have a length of 90% of the emission which may range from, for example, approximately 6-12 mm and more preferably, approximately 6 mm to 8 mm and a beam width of, for example, approximately 60-120 micron meters, and more preferably approximately 90 micron meters. The scan speed of the stage holding the wafer or device may be set in a range of, for example, approximately 100 mm/sec to approximately 400 mm/sec.

Figure 9:
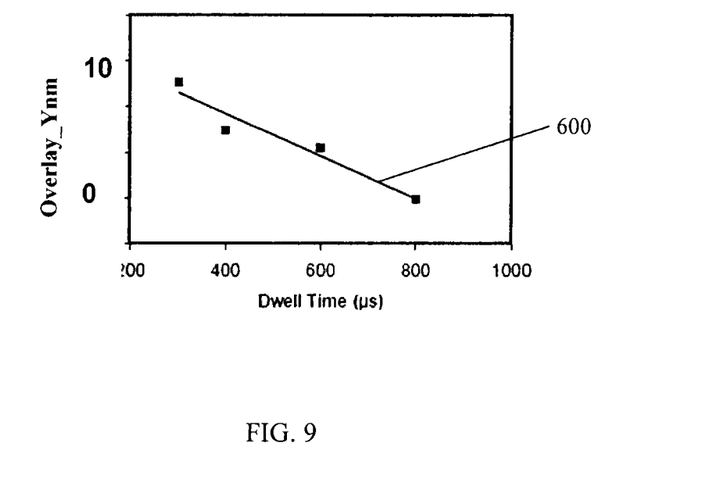
FIG. 9 depicts a graph of a transfer function curve, in accordance with one or more aspects of the present invention.

By way of example only, one detailed embodiment using a beam with a width of approximately 90 micron meters and a scan speed of approximately 128.5 mm/sec will have a dwell time of approximately 700µ seconds as the beam passes over the substrate or wafer. If wafer deformation is discovered during lithography, then the scan speed may be increased, for example, to approximately 225 mm/sec to attempt to remove the wafer deformation. By increasing the scan speed to approximately 225 mm/sec the dwell time of the beam over the wafer decreases to approximately 400µ seconds. If wafer deformation is still present during lithography, then the scan speed may be further increased, for example, to approximately 300 mm/sec. At a scan speed of 300 mm/sec, the dwell time of the beam over the wafer decreases to approximately 300µ seconds. As the scan speed is increased the dopants in the wafer must still be activated and this may be accomplished by increasing the intensity of the laser beam. In the present embodiment, the targeted anneal temperature for the substrate is, for example, approximately 1100° C. to 1400° C., and more preferably approximately 1150° C.-1275° C. Thus, as the scan speed and/or laser beam intensity parameters are adjusted, the user may make adjustments until optimal parameters are obtained which eliminate or reduce wafer deformation during thermal processing of the semiconductor devices. The parameters of the scan speed and beam width may be altered based on the machine being used and the device being fabricated. In addition, the parameters of the beam may be changed based on transfer function curves which may be created for the equipment being used by, for example, experimentally determining the dependencies between the overlay error and the wafer bow and/or dwell time. An example transfer function curve is shown in FIG. 9, which illustrates an example transfer function curve 600 for overlay versus one of the above noted LSA parameters, for example, dwell time.

Figure 7:
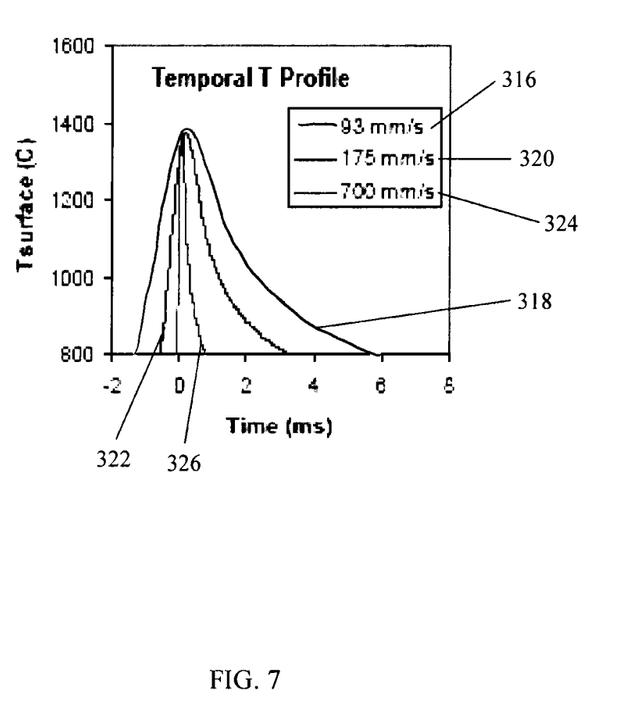
FIG. 7 depicts a graph of temperature ramp rates of the surface temperature of the semiconductor device during thermal processing based on changing stage velocity, in accordance with one or more aspects of the present invention.

FIG. 7 depicts, by way of example only, the ramp rate and cool down rate for wafers that are scanned with various stage velocities while maintaining a targeted anneal temperature. The ramp rate is determined based on the time it takes for the surface temperature of the wafer to change from its original temperature to the targeted temperature for annealing. As depicted, in one embodiment, the stage may include a first scan speed 316, for example, approximately 93 mm/sec, which produces a first ramp rate curve 318. If wafer or substrate deformation is found during the positioning of a first contact-to-gate layer over the third mask layer 300, then at least one parameter may be adjusted during the laser anneal on the a-Si 270 and a new wafer may be laser annealed. If the scan speed is adjusted to provide a second scan speed 320, for example, approximately 175 mm/sec, then a second ramp rate curve 322 is produced. Where deformation is still present in the wafer or substrate of the device, another adjustment to at least one of the parameters of the laser annealing 270 may be performed. In another embodiment, the scan speed may be adjusted to obtain a third scan speed 324, for example, approximately 700 mm/sec, which produces a third ramp rate curve 326. If the wafer deformation and induced errors are eliminated or sufficiently reduced and optimal parameters for thermal processing are obtained, then the parameters may be set and additional wafers may be thermally processed and passed on to the next fabrication processes. As illustrated to maintain a targeted anneal temperature as the stage velocity increases, the wafer will experience a higher temperature ramp rate and a faster cool down rate, as illustrated in FIG. 7.

Figure 3:
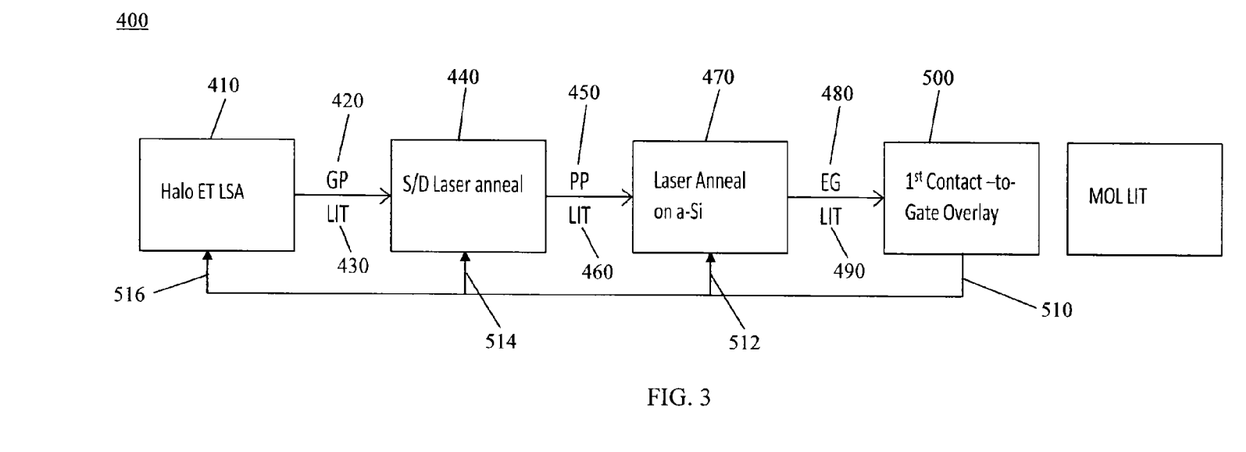
FIG. 3 depicts another embodiment of a portion of the process for fabricating, for instance, thermal processing and alignment of the layers of a semiconductor device, in accordance with one or more aspects of the present invention.
Figure 4:
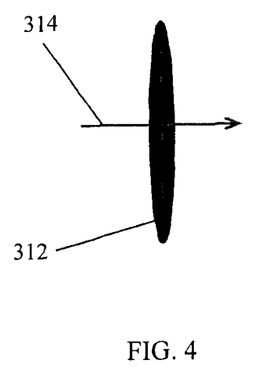
FIG. 4 depicts a laser beam for laser annealing, in accordance with one or more aspects of the present invention.
Figure 5:
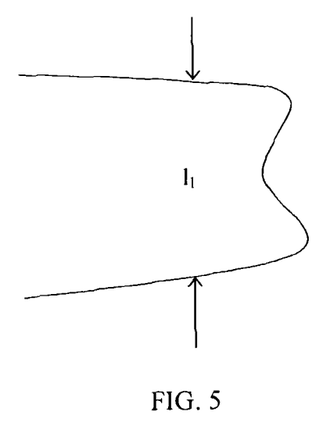
FIG. 5 depicts the length of the laser beam of FIG. 4, in accordance with one or more aspects of the present invention.
Figure 6:
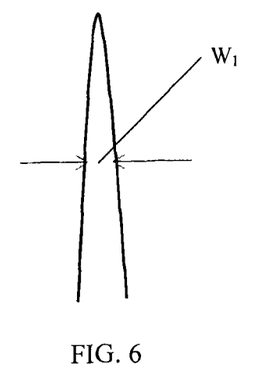
FIG. 6 depicts the width of a laser beam of FIG. 4, in accordance with one or more aspects of the present invention.

In another embodiment, as illustrated in FIG. 3, a portion of the semiconductor device fabrication process 400 in accordance with one or more aspects of the present invention may include: obtaining a device with at least one layer, laser spike annealing the top layer of the device 410, applying a first mask layer over the top layer 420, performing lithography on the first mask layer 430, laser annealing the source and drain layer 440, applying a second mask layer over the source and drain layer 450, performing lithography on the second mask layer 460, laser annealing an a-Si layer 470, applying a third mask layer over the a-Si layer 480, performing lithography on the third mask layer 490, positioning a first contact-to-gate layer over the third mask layer 500, and determining if an adjustment is needed to one or more parameters of at least one laser annealing beam used during the laser annealing process 510. The fabrication process may further include: adjusting one or more parameters of the laser anneal on a-Si 512; adjusting one or more parameters of the source/drain laser anneal 514, and/or adjusting one or more parameters of the laser spike anneal 516. The parameters of the laser anneals may be adjusted as described above with reference to FIG. 2 until the laser anneal has been optimized to eliminate and/or reduce the wafer deformation and induced errors created during the laser annealing of the layers of the substrate. In one embodiment, as described above, lithography may be performed on the first, second, and third mask layers. Alternatively, the first, second, and third mask layers may be removed prior to performing the lithography steps.

As described in greater detail above with reference to FIGS. 1 and 2, the portion of a fabrication process shown in FIG. 3 may also include performing a sequence of various semiconductor processes after lithography is performed on the mask layer 490. The sequence of processes may include, for example, RIE, diffusion, cleans, and the like, may be performed to form the desired topography on the wafer surface and/or the desirable dopant profile. The processes that are performed on the wafer may be selected in order to obtain a wafer with the desired electrical properties. In addition, in an embodiment, as described above with reference to FIG. 3, the lithography may be performed on the mask layers, resulting in the mask layers becoming a part of the device. Alternatively, in an embodiment, the mask layers may be removed or stripped from the surface of the device prior to performing lithography. In yet another embodiment, some mask layers may be stripped from the surface of the device prior to lithography and lithography may be performed directly on other mask layers.

Figure 8:
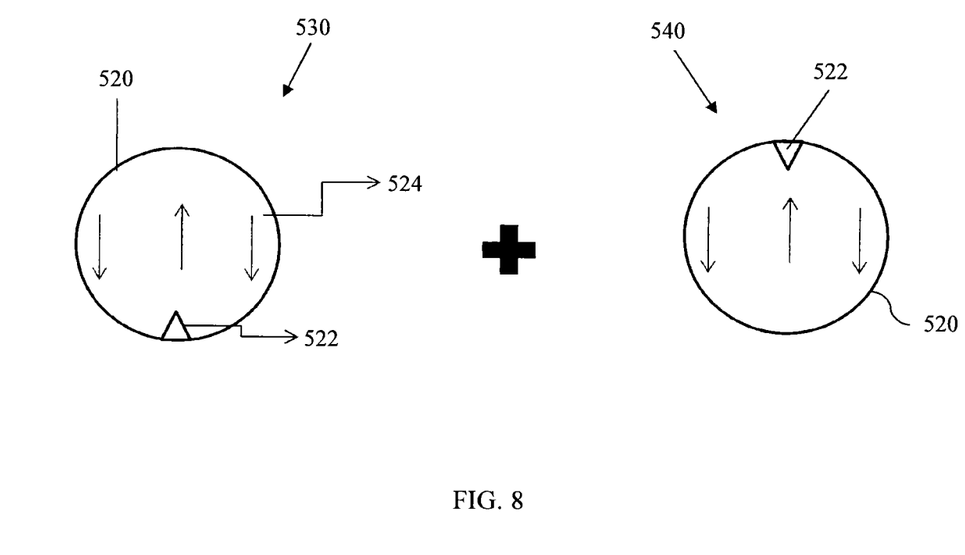
FIG. 8 depicts the varying wafer orientation during the thermal processing of FIG. 3, in accordance with one or more aspects of the present invention.

By way of specific example, as shown in FIG. 8, the portion of the semiconductor device fabrication process may also include adjusting the orientation of the substrate between laser annealing processes. As shown in FIG. 8, a substrate or wafer 520 is placed on a laser annealing chuck 522 in a specific orientation for fabrication which may include laser annealing. In one embodiment, laser spike annealing 410 may be performed on the wafer 520 in a first orientation 530, after the laser spike annealing 410 is completed overlay residuals 524 may be present. In order to remove the overlay residuals 524 the wafer 520 may be rotated, for example, approximately 180°, to a second orientation 540 and laser annealing of the next layer 440 may be performed on the wafer 520 in the second orientation 540. Thus, deformation of the wafer 520 and induced errors may be reduced or eliminated by not only adjusting the parameters of the laser annealing processes, but also by adjusting the orientation of the wafer during the laser annealing processes.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method, comprising:
   obtaining a device after at least one laser annealing process is completed, the device including a substrate surface and at least one layer over the substrate surface;
   applying a mask layer to the at least one layer;
   performing lithography on the mask layer to form a top layer;
   positioning a first contact-to-gate layer over the top layer;
   checking alignment of electrical connections between the substrate surface and the first contact-to-gate layer; and
   determining if an adjustment is needed to at least one parameter of at least one laser annealing beam used during the laser annealing process.

2. The method of claim 1, wherein the at least one laser annealing process comprises:
   performing a laser anneal on an amorphous silicon using the at least one laser annealing beam.

3. The method of claim 1, wherein the at least one laser annealing beam comprises:
   a dwell time.

4. The method of claim 3, wherein the dwell time comprises:
   a stage velocity; and
   a beam width.

5. The method of claim 4, further comprising:
   adjusting the dwell time of the at least one laser annealing beam.

6. The method of claim 5, wherein adjusting the dwell time of the at least one laser annealing beam comprises:
   adjusting the stage velocity.

7. The method of claim 6, wherein the stage velocity ranges from approximately 100 mm/sec to approximately 400 mm/sec.

8. The method of claim 4, wherein the beam width ranges from approximately 60 micron meters to approximately 120 micron meters.

9. The method of claim 1, wherein the at least one laser annealing process comprises:
   performing a first laser annealing to a top layer of the substrate surface;
   applying a first mask layer to the top layer; and
   performing lithography on the first mask layer.

10. The method of claim 9, wherein the at least one laser annealing process further comprises:
    performing a second laser annealing to the first mask layer;
    applying a second mask layer to the first mask layer; and
    performing lithography on the second mask layer.

11. The method of claim 10, wherein the at least on laser annealing process further comprises:
    performing a third laser annealing to the second mask layer.

12. The method of claim 11, further comprising:
    adjusting the at least one parameter of at least one laser annealing beam.

13. The method of claim 12, wherein the at least one parameter of at least one laser annealing beam of the first laser annealing is adjusted.

14. The method of claim 13, wherein the at least one parameter of at least one laser annealing beam of the second laser annealing is adjusted.

15. The method of claim 14, wherein the at least one parameter of at least one laser annealing beam of the laser annealing process is adjusted.

16. A process, comprising:
    obtaining a device with a wafer and at least one layer on top of the wafer;
    performing at least one laser annealing to the at least one layer, the at least one laser annealing using at least one laser beam;
    applying a mask layer over the at least one layer;
    performing lithography on the mask layer to form a contact layer;
    arranging an overlay on top of the contact layer;
    inspecting the alignment of the contact layer with the overlay;
    determining an amount of wafer deformation; and
    adjusting the at least one laser beam to remove wafer deformation.

17. The process of claim 16, wherein the at least one laser beam comprises:
    a dwell time including a stage velocity and a beam width.

18. The process of claim 17, wherein the adjusting the at least one laser beam comprises:
    adjusting the stage velocity.

19. The process of claim 18, wherein the stage velocity ranges from approximately 100 mm/sec to approximately 400 mm/sec.

20. The process of claim 19, wherein the beam width ranges from approximately 60 micron meters to approximately 120 micron meters.

* * * * *